US008532838B2

(12) United States Patent
Allard et al.

(10) Patent No.: US 8,532,838 B2
(45) Date of Patent: Sep. 10, 2013

(54) SYSTEM, METHOD, AND COMPUTER PROGRAM PRODUCT FOR CONTROLLING ENERGY CONSUMPTION IN DATA CENTERS

(75) Inventors: Frederic Allard, La Gaude (FR); Jean-Marc Legrand, La Gaude (FR); Jean-Louis Veran, La Colle sur Loup (FR)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 13/046,839

(22) Filed: Mar. 14, 2011

(65) Prior Publication Data

US 2012/0065809 A1 Mar. 15, 2012

(30) Foreign Application Priority Data

Jun. 25, 2010 (EP) .................................. 10305680

(51) Int. Cl.
  *G05D 23/00* (2006.01)
  *G01M 1/38* (2006.01)
  *G05B 13/00* (2006.01)
  *G05B 15/00* (2006.01)

(52) U.S. Cl.
  USPC ........... 700/300; 700/276; 700/277; 700/299; 62/120

(58) Field of Classification Search
  USPC ... 700/22, 276–278, 299–300; 713/300–340; 62/119–12, 171, 175, 311; 361/690, 694–696; 454/184
  See application file for complete search history.

(56) References Cited

U.S. PATENT DOCUMENTS

| | | | | |
|---|---|---|---|---|
| 7,031,870 B2* | 4/2006 | Sharma et al. | ................ | 702/130 |
| 7,155,318 B2* | 12/2006 | Sharma et al. | ................ | 700/276 |
| 8,141,374 B2* | 3/2012 | Hay | .............................. | 62/175 |
| 8,310,829 B2* | 11/2012 | Monk et al. | .................... | 361/696 |
| 2005/0267639 A1* | 12/2005 | Sharma et al. | ................ | 700/276 |
| 2006/0100744 A1* | 5/2006 | Sharma et al. | ................ | 700/276 |

(Continued)

FOREIGN PATENT DOCUMENTS

| | | |
|---|---|---|
| DE | 3823653 C1 | 2/1990 |
| EP | 1903849 A1 | 3/2008 |

OTHER PUBLICATIONS

Francois Toussaint, PCT Notification of Transmittal of the International Search Report and the Written Opinion of the International Searching Authority, or the Declaration, International Application No. PCT/EP2011/059095, Oct. 7, 2011, 10 pages.

*Primary Examiner* — Ramesh Patel
(74) *Attorney, Agent, or Firm* — Douglas A. Lashmit; Hoffman Warnick LLC

(57) ABSTRACT

System and method for controlling energy consumption in a data center. An embodiment includes: segregating hot air from cold air by preventing hot air exhausted from hot aisles from flowing into cold aisles; measuring temperature and relative humidity values of the segregated hot and cold air; detecting temperature and relative humidity values of outside air; mixing the segregated hot air with a volume of the outside air, the volume of the outside air depending on a result of the measuring and the detecting; measuring temperature and relative humidity values of the mixed air; comparing the temperature and relative humidity values of the mixed air and the temperature and relative humidity values of the segregated cold air to IT specifications; cooling the mixed air based on a result of the comparison; and providing the cooled mixed air in the cold aisles.

15 Claims, 5 Drawing Sheets

(56) References Cited

U.S. PATENT DOCUMENTS

| | | | |
|---|---|---|---|
| 2007/0274035 A1* | 11/2007 | Fink et al. | 361/687 |
| 2009/0168345 A1* | 7/2009 | Martini | 361/691 |
| 2009/0210096 A1* | 8/2009 | Stack et al. | 700/278 |
| 2010/0029193 A1* | 2/2010 | Ahladas et al. | 454/184 |
| 2010/0035535 A1 | 2/2010 | Taylor | |
| 2010/0154448 A1* | 6/2010 | Hay | 62/175 |
| 2011/0100618 A1* | 5/2011 | Carlson | 165/287 |
| 2011/0225997 A1* | 9/2011 | Gast et al. | 62/121 |
| 2012/0234527 A1* | 9/2012 | Murayama et al. | 165/287 |
| 2012/0309284 A1* | 12/2012 | Dernis et al. | 454/184 |

* cited by examiner

SYSTEM, METHOD, AND COMPUTER PROGRAM PRODUCT FOR CONTROLLING ENERGY CONSUMPTION IN DATA CENTERS

TECHNICAL FIELD

The present invention relates generally to the field of data centers, and more particularly to a system and method for controlling the energy consumption in data centers.

RELATED ART

A traditional data center conventionally includes a plurality of individual computing resources. A data center (or other physical space) beneficially has, where possible, a cooling infrastructure which ensures proper operational conditions. Maintaining data centers at desired temperatures (e.g., set points) helps prevent computer hardware (e.g., information technology (IT) infrastructure) from overheating and malfunctioning. To this end, many data centers are maintained or cooled to relatively low temperatures (e.g., 65° F.) using computer room air conditioning machines (CRACs) which flow cooled air to the IT equipment space, to increase equipment reliability and useful life, and to avoid downtime for repair and/or replacement.

Moreover, data center temperatures are routinely changing, depending on which IT equipment is running at any given time. To accommodate moving hot spot targets, existing systems resort to a sort of 'overkill' by cooling the entire volume of the data center to well below the set point and/or cooling the data center at all times. This approach incurs increased operational costs.

With the increasing awareness and desire to operate in a green manner, an excessive use of energy is undesirable and increases the data center operational costs.

Conventional data centers, which provide a constant data center temperature or provide reactionary cooling (i.e., cooling in response to a detected rise in data center temperature), do not account for and/or leverage current energy costs. Moreover, in the previous art approaches, the power usage effectiveness (PUE) which is the ratio of the total power usage divided by the total power IT usage is generally around two.

Thus, it is highly desirable to reduce the PUE in data centers, to reduce the energy consumption of the cooling equipment, or reclaim some of that power, to reduce data center operating cost and limit its impact on the environment.

Moreover, with the continuous increase of the IT equipment power, the range of temperatures existing in a data center is so large that there are many hot spots out of the temperature IT specifications.

Thus, it is also highly desirable to control the energy consumption while meeting the environmental IT specifications.

SUMMARY OF THE INVENTION

Accordingly, the present invention provides a system and a method for reducing the operating cost of data centers, and for reducing the energy consumption of the cooling equipment of data centers by optimizing the use of cold air produced. The impact on the environment is reduced by improving the power usage effectiveness (PUE) ratio by optimizing the PUE to reach a value equal to about 1.5 (for a typical existing data center). The PUE can reach a better value less than 1.5 if the data center is created from scratch).

The present invention also provides a system and method that monitor conjointly the temperature and the relative humidity of a data center.

In an aspect of the invention, there is provided a method for controlling energy consumption in a data center, the data center having a cold-hot aisles configuration of IT equipment racks having IT temperature and relative humidity air specifications, the method comprising: segregating hot air from cold air by preventing hot air exhausted from hot aisles from flowing into cold aisles; measuring temperature and relative humidity values of the segregated hot air and the segregated cold air; detecting temperature and relative humidity values of outside air; mixing the segregated hot air with a volume of the outside air, the volume of the outside air depending on a result of the measuring and the detecting; measuring temperature and relative humidity values of the mixed air; comparing the temperature and relative humidity values of the mixed air and the temperature and relative humidity values of the segregated cold air to the IT specifications; cooling the mixed air based on a result of the comparison; and providing the cooled mixed air in the cold aisles.

In another aspect of the invention, there is provided a system for controlling energy consumption in a data center, the data center including a cold-hot aisles configuration of IT equipment racks having IT temperature and relative humidity air specifications, the system comprising: a system for segregating hot air from cold air by preventing hot air exhausted from hot aisles from flowing into cold aisles; a system for measuring temperature and relative humidity values of the segregated hot air and the segregated cold air; a system for detecting temperature and relative humidity values of outside air; a system for mixing the segregated hot air with a volume of the outside air, the volume of the outside air depending on a result of the measuring and the detecting; a system for measuring temperature and relative humidity values of the mixed air; a system for comparing the temperature and relative humidity values of the mixed air and the temperature and relative humidity values of the segregated cold air to the IT specifications; a system for cooling the mixed air based on a result of the comparison; and a system for providing the cooled mixed air in the cold aisles.

In another aspect of the invention, there is provides a computer readable medium having a computer program stored thereon, which when executed by a computing device, performs a method for controlling energy consumption in a data center, the data center including a cold-hot aisles configuration of IT equipment racks having IT temperature and relative humidity air specifications, the method comprising: segregating hot air from cold air by preventing hot air exhausted from hot aisles from flowing into cold aisles; measuring temperature and relative humidity values of the segregated hot air and the segregated cold air; detecting temperature and relative humidity values of outside air; mixing the segregated hot air with a volume of the outside air, the volume of the outside air depending on a result of the measuring and the detecting; measuring temperature and relative humidity values of the mixed air; comparing the temperature and relative humidity values of the mixed air and the temperature and relative humidity values of the segregated cold air to the IT specifications; cooling the mixed air based on a result of the comparison; and providing the cooled mixed air in the cold aisles.

Further aspects of the invention will now be described, by way of implementation and examples, with reference to the accompanying figures.

BRIEF DESCRIPTION OF THE DRAWINGS

The above and other items, features and advantages of the invention will be better understood by reading the following more particular description of the invention in conjunction with the figures wherein.

Corresponding reference numerals indicate corresponding parts throughout the several views of the drawings.

DETAILED DESCRIPTION OF THE INVENTION

Embodiments of the invention are described herein after by way of examples with reference to the accompanying figures and drawings.

Figure 1:
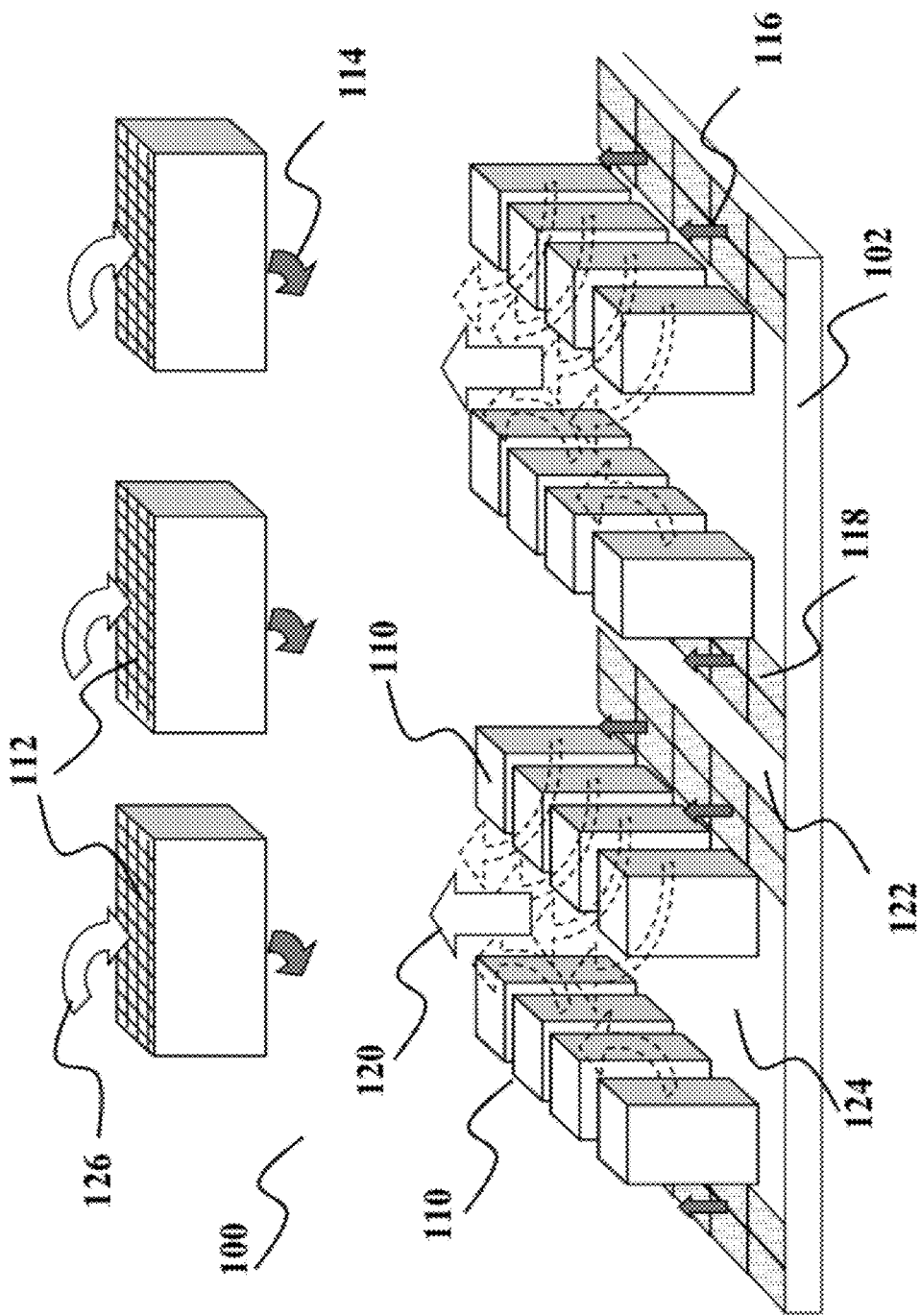
FIG. 1 is a schematic view of cold aisles and hot aisles separation in a conventional data center.

In a typical data center (100) as illustrated in FIG. 1, adjacent IT equipment racks (110) located on a raised-floor (102) are placed in rows face to face or back to back in order to create alternate hot aisles (124) and cold aisles (122). Hot air flowing through data center (100) is indicated by light arrows (120, 126) and cooled air flowing through data center (100) is indicated by dark arrows (114, 116). Cold air (116) blown under the raised-floor (102) by a sub-floor cooling system is provided in the cold aisles (122) in between of two adjacent rack rows facing each other through perforated floor tiles (118) sucked in through a front of each rack. This cold air is collected by the cooling fans of IT equipment in the racks and is exhausted (120) at the back of the rack row in the hot aisles (124) where two adjacent rack rows are back to back. The exhausted hot air (126) is collected in air conditioning units (ACUs) (112), cooled in the ACUs (112) to circulate back as cold air (114) to the sub-floor cooling system.

Figure 2:
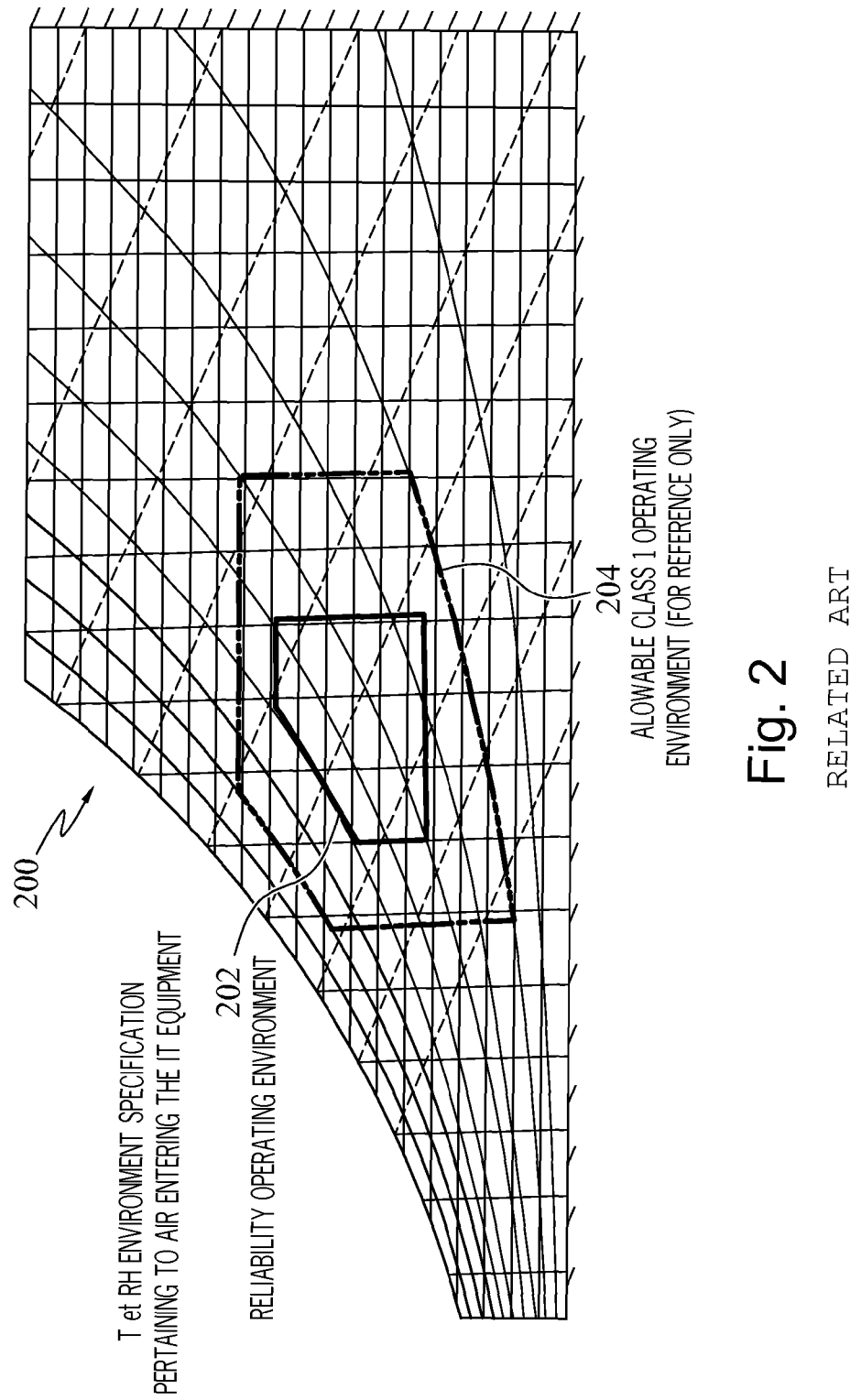
FIG. 2 shows operating areas, on temperature and relative humidity curves, covered by the system of the present invention.

FIG. 2 shows a psychrometric graph (200) as well known in the field of thermodynamics, where the vertical lines represent iso temperature, the horizontal lines represent constant water content, and curved lines represent constant relative humidity (RH). The extreme left curved line represents the saturation 100% RH, also known as the dew point. Two major areas are shown in FIG. 2. A first area (202) of temperature and relative humidity illustrates the zone that ensures a reliable operating environment for IT equipment. In an embodiment, this area is fenced by a low end temperature (18° C./64.4° F.), a high end temperature (27° C./90.6° F.), a low end moisture/humidity (5.5° C. dew point/41.8° F.) and a high end moisture (60% RH and 15° C. dew point/59° F.). A second area (204) illustrates an allowable operating environment zone in which IT equipment can operate without impacting the reliability of the IT equipment, but only temporarily. This area is for reference only. As already indicated, the invention consists in monitoring both temperature (T) and relative humidity (RH) to allow the overall system to work in the required reliable operational conditions instead of operating at a given temperature target as in the related art.

Figure 3:
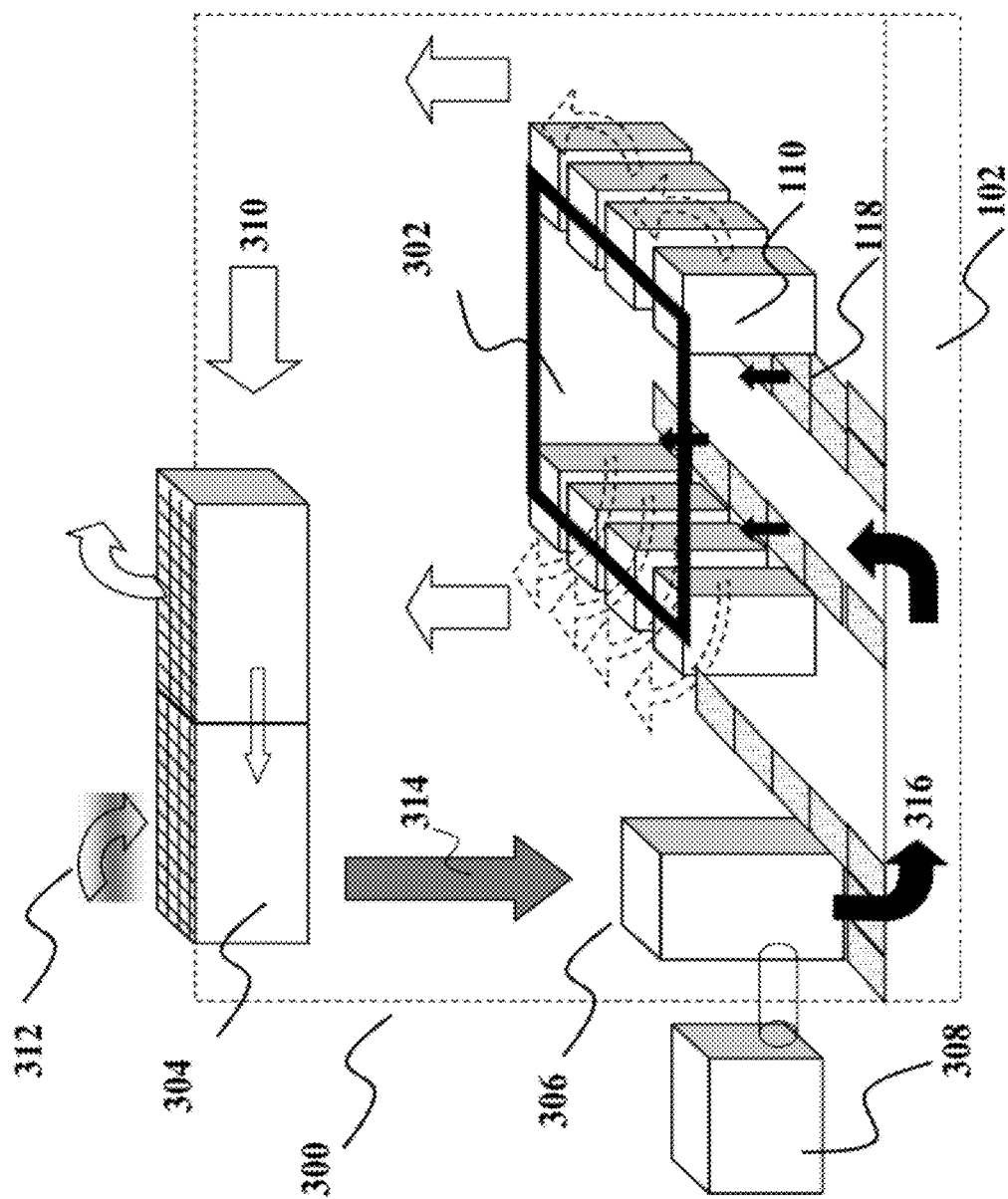
FIG. 3 is a schematic high level view of a system of the present invention according to an embodiment.

Referring now to FIG. 3, an illustrative embodiment of the overall system of the present invention is depicted. For clarity of illustration, only one cold aisle is illustrated, but one skilled in the art would realize that a data center may comprise a plurality of cold and hot aisles. Data center (300) has IT equipment racks (110) located on raised-floor (102) in a cold aisles/hot aisles configuration as described above with reference to FIG. 1. Hot air flow through data center (300) is indicated by light arrows and cold air flow through data center (300) is indicated by dark arrows.

A first principle implemented in embodiments of the present invention is the separation of the hot air from the cold air, wherein the hot air is prevented from recirculating into the cold aisles. To achieve this, in accordance with an embodiment, the cold aisles are isolated from the hot air and a roof arrangement (302) is disposed over the cold aisles. The roof arrangement (302) creates cold air tunnels thereby avoiding hot spots and allowing an homogeneous air environment to be maintained along the cold aisle tunnels.

With this arrangement, all cold air produced within the cold aisles goes through the IT equipment, and there is no loss of cold air.

The roof arrangement (302) may vary in size and material used. In an embodiment, the roof is made of a plastic film extending from one row to the opposite row and covering the whole cold aisle. The segregation of hot/cold air can be achieved by using different devices such as aluminum structures supporting plastic roofs and side curtains adjusted to the size of the IT equipment, and end curtains to close the corridor. Various adaptations and arrangement may be made without departing from the scope of the present invention.

The tunnels hence created allow uniform temperature and relative humidity air values to be maintained within the tunnel areas.

The hot air exhausted from the several hot aisles is sucked towards the ceiling by an air mixing unit (304). The air mixing unit (AMU) (304) is preferably located close to the ceiling of the data center. As it will be detailed below with reference to FIG. 4, the AMU (304) delivers air that is a mix of outside air and the hot air input from the data center room.

A fan (429) (FIG. 4) may be installed at the output of the AMU (304) to warm the mixed air before it flows to the CARC as now described.

Figure 5:
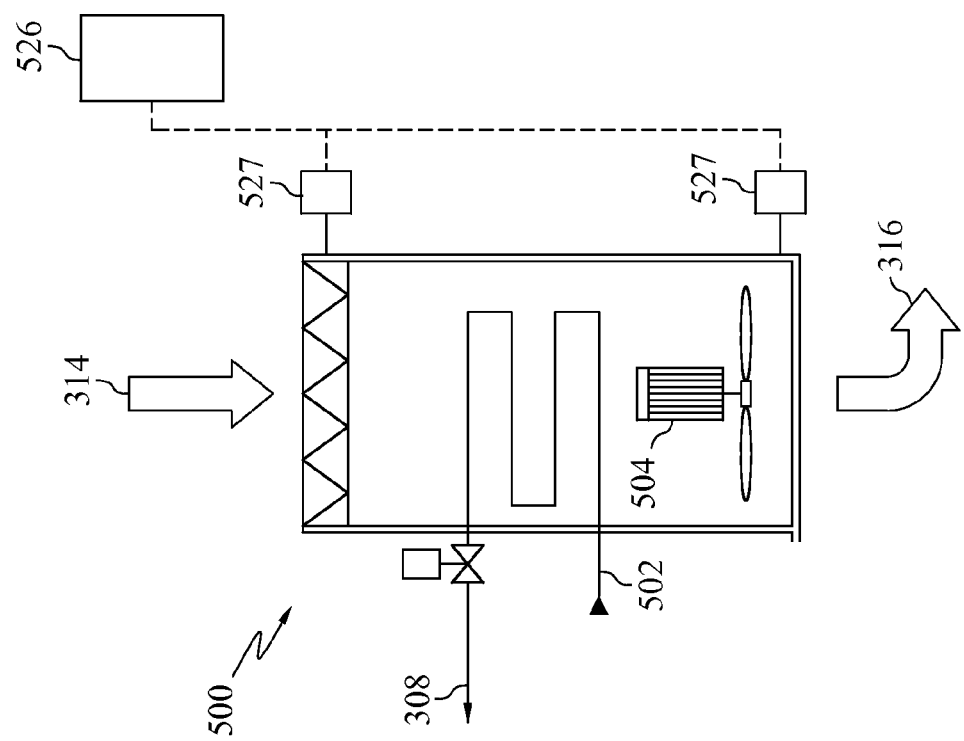
FIG. 5 is a schematic view of a CRAC as used in an embodiment of the present invention.

The air exhausted from the AMU (304) is then sucked into a CRAC machine (306). The CRAC (306) as further detailed with reference to FIG. 5 is coupled to a chilled water apparatus (308) and provides a cooled air flow (316) that falls within the temperature and relative humidity values required by the IT equipment specifications. The air is finally pushed into the sub-floor (102) and blown in the cold aisles through the perforated tiles as previously described.

As already mentioned, the tunnel arrangement in the cold aisles prevents hot spots as is the case in the related art and also contributes to reduce the total air cooling energy consumption.

The overall system allows the CRAC (306) to provide the required flow of cooled air to meet the temperature and relative humidity target requirements.

Sensors and control computing units are coupled to the AMU (304) and to the CRAC (306) to measure and control respectively the volume of exterior air and the chilled water necessary to meet the required temperature and relative humidity values.

Additionally, when the load of the IT equipment increases, the temperature of the hot air increases. A sensor measuring the hot air temperature drives the CRAC fan speed accordingly (increasing the speed, and thus the air volume flow, when temperature increases). Similarly, when the IT load goes down, the hot air temperature decreases and the control units adapt the speed of the fans to blow less cold air. The usage of cold air is thus minimum.

The mixed air at the input of the CRAC (306) is provided by the AMU (304) which delivers an air flow having a (T, RH) value as close as possible to the one required for the IT equipment in the cold aisles.

The mixed air is made of a mix of hot air from the data center and outside air. The outside air meets IT environmental condition requirements most of time through the year. Therefore, the mixed air provided by the AMU (304) is optimizing the quantity of chilled water that is needed in the CRAC (306). The overall costs are reduced.

The mixed air is adjusted at the target temperature and humidity within the CRAC (306) which can use chilled water, when the outside air conditions are not appropriate.

An additional free chilling system may also be added on the piping circuit between the chiller and the CRAC (306) to further improve the energy efficiency of the chilled water production.

Figure 4:
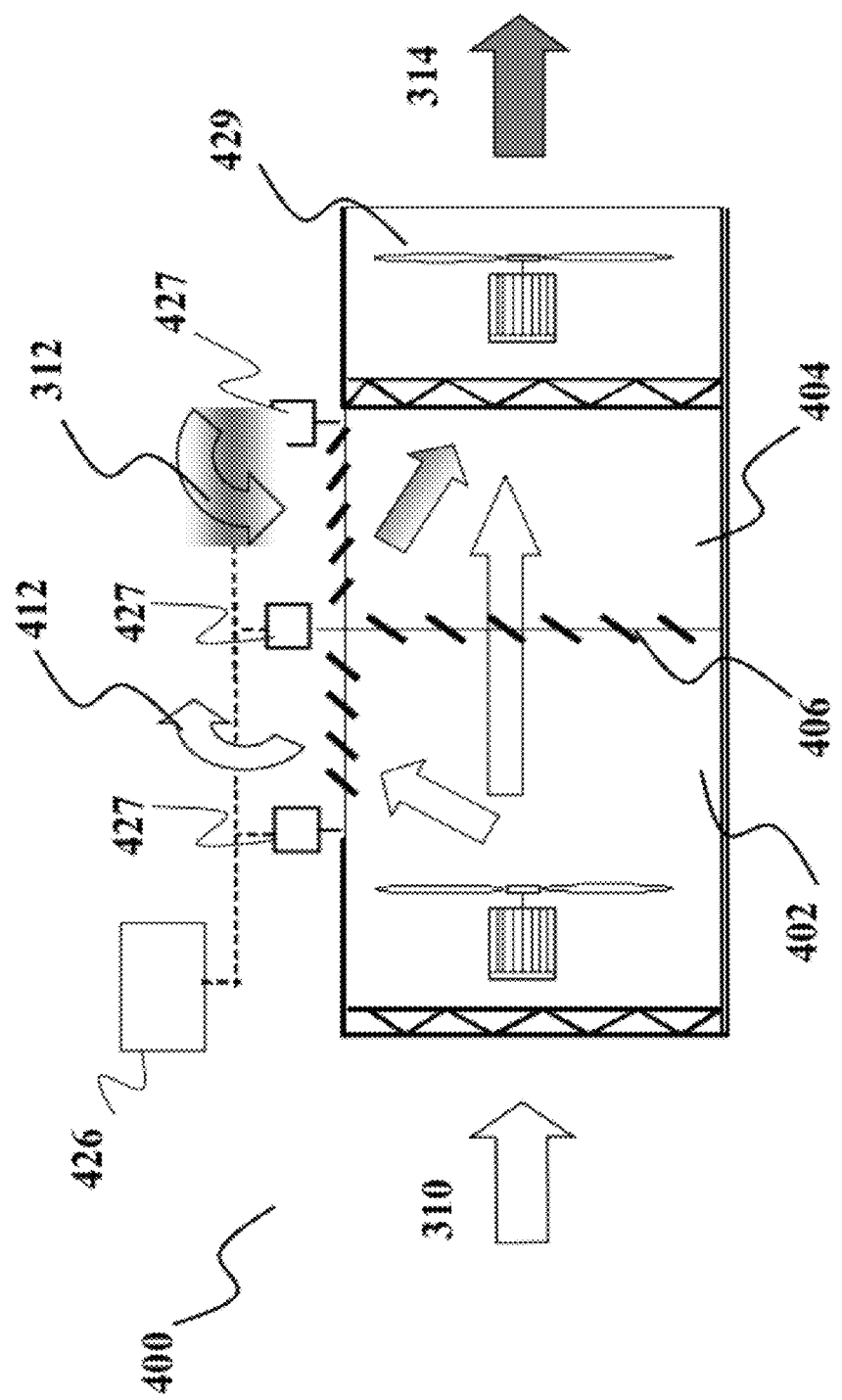
FIG. 4 is a schematic view of an air mixing unit as used in an embodiment of the present invention.

Referring now to FIG. 4, an air mixing unit which drives the optimization of mixed air between outside air and inside hot air is shown. The hot air (310) exhausted from the IT equipment is input at the AMU (400). Inside a first section (402) of the AMU (400), a volume of the hot air (412) is exhausted outside the data center while another volume is transmitted to a second section (404) of the AMU (400). In the second section (404), the transmitted air is mixed with outside air (312) if T and RH are suitable, based on information received by a control unit (426). The control unit (426) further comprises a gate control system (427) to control the different gates (406) of the AMU (400), allowing mixing in volume the inside and outside air together. The resulting air is provided with a temperature and relative humidity as close as possible to the environmental air specifications for the IT equipment. It should be noted that CRAC unit is only able to cool and not warm air.

In an embodiment, the temperature is set in a range of about 18° C. (64.4° F.) to about 27° C. (90.6° F.), the humidity range is from about 5.5° C. dew point (41.8° F.), about 60% RH and about 15° C. dew point (59° F.), which are the conditions that guarantee the reliability of the IT equipment. One could refer to the TC9.9 2008 recommendations of the American Society of Heating, Refrigerating, & Air-Conditioning Engineers (ASHRAE).

The mixed air (314) is blown out of the AMU (400) to be drawn at the CRAC entry.

In a variant implementation, a recycling system allows to pick up and use a same quantity than the external air volume provided to the AMU (400) to warm up other rooms/buildings (when needed, e.g., in winter).

Referring to FIG. 5, a CRAC (500) as used in the present invention is shown. The CRAC (500) is configured to take the mixed air (314) that is exhausted from the AMU, to eventually chill (308, 502) the mixed air, and blow out the chilled air (316) out of the CRAC (500) into the sub-floor using the fan (504).

The T and RH values are captured and controlled by sensors and control units (526, 527) at the entry and output of the CRAC (500). The chilling energy necessary to reach the required (T, RH) values depends, for example, on the values measured at the entry of the CRAC (500). The chilled water may be further refreshed with an air fan system (308) to reduce the use of the chillers (free chilling). The resultant air (316) is at the T and RH values required at the IT equipment entry.

The description of the present invention has been presented for purposes of illustration and description, and is not intended to be exhaustive or limited to the invention in the form disclosed. Many modifications and variations will be apparent to those of ordinary skill in the art. The embodiments were chosen and described in order to best explain the principles of the invention, the practical application, and to enable others of ordinary skill in the art to understand the invention for various embodiments with various modifications as are suited to the particular use contemplated.

Some element(s) of the present invention can take the form of a computer program product accessible from a computer-usable or computer-readable medium providing program code for use by, or in connection with a computer or any instruction execution system. For the purposes of this description, a computer-usable or computer-readable medium can be any tangible apparatus that can contain, store, communicate, propagate, or transport the program for use by, or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

It has to be appreciated that while the invention has been particularly shown and described with reference to a various embodiments, various changes in form and detail may be made therein without departing from the spirit, and scope of the invention. The embodiments have been shown with separated AMU and CRAC machines, but any alternative implementation such as a unique machine combining the functions of both the AMU and the CRAC could be devised to operate the method of the invention.

The invention claimed is:

1. A method for controlling energy consumption in a data center, the data center including a cold-hot aisles configuration of IT equipment racks having IT temperature and relative humidity air specifications, the method comprising:
    segregating hot air from cold air by preventing hot air exhausted from hot aisles from flowing into cold aisles from the hot aisles, the segregating including forming a cold air tunnel in each cold aisle by covering each cold aisle with a roof arrangement;
    measuring temperature and relative humidity values of the segregated hot air and the segregated cold air;
    detecting temperature and relative humidity values of outside air;
    mixing the segregated hot air with a volume of the outside air, the volume of the outside air depending on a result of the measuring and the detecting;
    measuring temperature and relative humidity values of the mixed air;
    comparing the temperature and relative humidity values of the mixed air and the temperature and relative humidity values of the segregated cold air to the IT specifications;
    cooling the mixed air based on a result of the comparison; and
    providing the cooled mixed air in the cold aisles.

2. The method of claim 1, wherein the roof arrangement comprises a plastic film extending between two adjacent IT equipment racks.

3. The method of claim 1, wherein the measuring of the temperature and relative humidity values of the segregated hot air further comprises sensing the temperature and relative humidity of the segregated hot air flowing close to a ceiling of the data center.

4. The method of claim 1, wherein the mixing further comprises exhausting outside the data center an exhausted air volume of the segregated hot air, thereby leaving an inside air volume.

5. The method of 4, wherein the outside air volume is mixed with the inside air volume.

6. The method of claim 1, wherein the cooling further comprises inputting the mixed air into a computer room air conditioning (CRAC) machine and supplying chilled water into the CRAC machine.

7. The method of claim 1, wherein providing the cooled air into the cold aisles further comprises blowing the cooled air into a sub-floor of the data center and exhausting the cooled air through perforated tiles of the cold aisles.

8. A system for controlling energy consumption in a data center, the data center including a cold-hot aisles configuration of IT equipment racks having IT temperature and relative humidity air specifications, the system comprising:
   a system for segregating hot air from cold air by preventing hot air exhausted from hot aisles from flowing into cold aisles from the hot aisles, the system for segregating including a roof arrangement for covering each cold aisle to form a cold air tunnel in each cold aisle;
   a system for measuring temperature and relative humidity values of the segregated hot air and the segregated cold air;
   a system for detecting temperature and relative humidity values of outside air;
   a system for mixing the segregated hot air with a volume of the outside air, the volume of the outside air depending on a result of the measuring and the detecting;
   a system for measuring temperature and relative humidity values of the mixed air;
   a system for comparing the temperature and relative humidity values of the mixed air and the temperature and relative humidity values of the segregated cold air to the IT specifications;
   a system for cooling the mixed air based on a result of the comparison; and
   a system for providing the cooled mixed air in the cold aisles.

9. The system of claim 8, wherein the roof arrangement comprises a plastic film extending between two adjacent IT equipment racks.

10. The system of claim 8, wherein the system for measuring of the temperature and relative humidity values of the segregated hot air further comprises a system for sensing the temperature and relative humidity of the segregated hot air flowing close to a ceiling of the data center.

11. The system of claim 8, wherein the system for mixing further comprises a system for exhausting outside the data center an exhausted air volume of the segregated hot air, thereby leaving an inside air volume.

12. The system of 11, wherein the outside air volume is mixed with the inside air volume.

13. The system of claim 8, wherein the system for cooling further comprises a system for inputting the mixed air into a computer room air conditioning (CRAC) machine and a system for supplying chilled water into the CRAC machine.

14. The system of claim 8, wherein the system for providing the cooled mixed air in the cold aisles further comprises a system for blowing the cooled air into a sub-floor of the data center and a system for exhausting the cooled air through perforated tiles of the cold aisles.

15. A computer readable storage medium having a computer program stored thereon, which when executed by a computing device, performs a method for controlling energy consumption in a data center, the data center including a cold-hot aisles configuration of IT equipment racks having IT temperature and relative humidity air specifications, the method comprising:
   segregating hot air from cold air by preventing hot air exhausted from hot aisles from flowing into cold aisles from the hot aisles, the segregating including forming a cold air tunnel in each cold aisle by covering each cold aisle with a roof arrangement;
   measuring temperature and relative humidity values of the segregated hot air and the segregated cold air;
   detecting temperature and relative humidity values of outside air;
   mixing the segregated hot air with a volume of the outside air, the volume of the outside air depending on a result of the measuring and the detecting;
   measuring temperature and relative humidity values of the mixed air;
   comparing the temperature and relative humidity values of the mixed air and the temperature and relative humidity values of the segregated cold air to the IT specifications;
   cooling the mixed air based on a result of the comparison; and
   providing the cooled mixed air in the cold aisles.

\* \* \* \* \*